(12) United States Patent
Kobayashi

(10) Patent No.: US 7,719,914 B2
(45) Date of Patent: May 18, 2010

(54) SEMICONDUCTOR MEMORY AND TEST SYSTEM

(75) Inventor: Hiroyuki Kobayashi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 47 days.

(21) Appl. No.: 12/239,052

(22) Filed: Sep. 26, 2008

(65) Prior Publication Data
US 2009/0027982 A1    Jan. 29, 2009

Related U.S. Application Data

(63) Continuation of application No. PCT/JP2006/306266, filed on Mar. 28, 2006.

(51) Int. Cl.
*G11C 7/02* (2006.01)

(52) U.S. Cl. ............... 365/210.1; 365/200; 365/201; 365/189.07

(58) Field of Classification Search .............. 365/210.1, 365/200, 201, 189.07
See application file for complete search history.

(56) References Cited

U.S. PATENT DOCUMENTS 5,568,432 A    10/1996  Wada
6,862,232 B2 *  3/2005  Hanzawa et al. ............. 365/200
7,035,151 B2 *  4/2006  Tran et al. .................... 365/200
7,054,214 B2 *  5/2006  Hanzawa et al. ......... 365/210.1
2001/0026483 A1  10/2001  Hasegawa et al.

FOREIGN PATENT DOCUMENTS

| JP | 11-102598 A | 4/1999 |
| JP | 2003-007091 A | 1/2003 |
| JP | 2005-063529 A | 3/2005 |

* cited by examiner

*Primary Examiner*—Huan Hoang
(74) *Attorney, Agent, or Firm*—Arent Fox LLP

(57) ABSTRACT

A cell array has a word line and a bit line coupled to memory cells, and a redundancy word line and a redundancy bit line coupled to redundancy memory cells. A read unit reads data held in the memory cell. A defect detection input unit receives a defect detection signal from a test apparatus. A dummy defect output unit outputs a dummy defect signal during a predetermined period of time after the defect detection input unit receives the defect detection signal. A data output unit inverts a logic of the read data output from the read unit during an activation of the dummy defect signal. Accordingly, an artificial defect can be generated by the semiconductor memory without changing the test apparatus or a test program. As a result of this, a relief efficiency can be enhanced and a test cost can be reduced.

20 Claims, 13 Drawing Sheets

US 7,719,914 B2

SEMICONDUCTOR MEMORY AND TEST SYSTEM

CROSS-REFERENCE TO RELATED APPLICATION

This application is a Continuation Application of International Application No. PCT/JP2006/306266, filed Mar. 28, 2006, designating the U.S., the entire contents of which are incorporated herein by reference.

BACKGROUND

1. Field

The present embodiments relate to a semiconductor memory.

2. Description of the Related Art

A semiconductor memory has a redundancy circuit in order to relieve defects caused by a lattice defect in a substrate and particles produced in a manufacture process and to improve the yield. A semiconductor memory such as a DRAM has a redundancy word line and a redundancy bit line in addition to a normal word line and bit line. When a defect of a memory cell is detected, a fuse circuit formed on the semiconductor memory is programmed in a test process in order to replace a defective word line or a defective bit line with the redundancy word line or the redundancy bit line. By relieving the defective memory cell using the redundancy circuit, the yield of the semiconductor memory is improved.

For instance, Japanese Laid-open Patent Publication No. 2003-7091 and the like disclose a method of making, when the single bit defect is generated due to the insufficiency of operation margin, normal memory cells defective using the LSI tester, until the single bit defect is determined as the bit line defect.

SUMMARY

According to one aspect of embodiments, a semiconductor memory is provided which includes a cell array having a word line and a bit line coupled to memory cells, and a redundancy word line and a redundancy bit line coupled to a redundancy memory cell, a read unit reading data held in the memory cells, a defect detection input unit receiving a defect detection signal, a dummy defect output unit outputting a dummy defect signal during a predetermined period of time after the defect detection input unit receives the defect detection signal, and a data output unit inverting a logic of read data output from the read unit during an activation of the dummy defect signal.

DETAILED DESCRIPTION OF THE EMBODIMENTS

Figure 1:
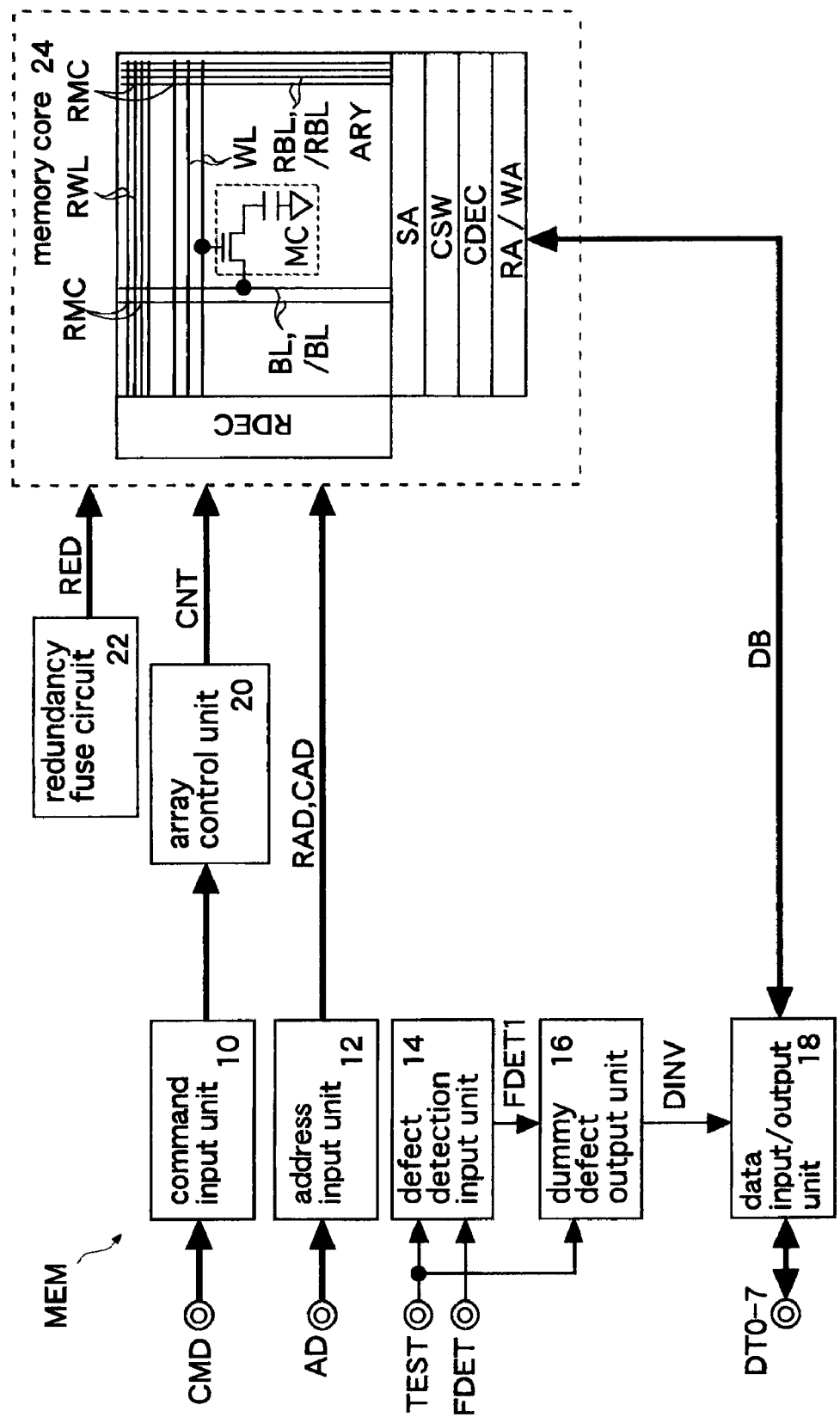
FIG. 1 illustrates a block diagram showing a semiconductor memory according to a first embodiment.

In the test process, the fuse circuit is programmed in accordance with a predetermined rule. For instance, a word line defect is relieved by using the redundancy word line, and a bit line defect is relieved by using the redundancy bit line. A single bit defect is relieved by preferentially using either the redundancy word line or the redundancy bit line. For example, when an LSI tester and a fuse blow apparatus which programs the fuse circuit preferentially use the redundancy word line, the single bit defect is relieved by using the redundancy word line, and when a further defect is detected, the redundancy bit line is used.

For instance, when an operation margin of sense amplifier is slightly insufficient due to a variation of manufacture condition of the semiconductor memory, there is a case where a plurality of single bit defects, not the bit line defects, are sporadically generated. In such a case, since the single bit defect is generated on the same bit line, it is better to relieve the single bit defect by using the redundancy bit line rather than by using the redundancy word line in terms of relief efficiency. However, if the LSI tester and the fuse blow apparatus are designed to preferentially use the redundancy word line, the single bit defect is relieved by using the redundancy word line. As a result of this, the relief efficiency is lowered, which may decrease the yield of the semiconductor memory.

In the drawings, a bold signal line denotes a plurality of signal lines. A part of a block coupled to a bold line is composed of a plurality of circuits. A signal line through which a signal is transferred is denoted by a symbol equal to the name of the signal. In the drawings, double circles denote an external terminal.

FIG. 1 illustrates a semiconductor memory according to a first embodiment. A semiconductor memory MEM is, for example, a DRAM having dynamic memory cells. The memory MEM has a command input unit 10, an address input unit 12, a defect detection input unit 14, a dummy defect output unit 16, a data input/output unit 18, an array control unit 20, a redundancy fuse circuit 22, and a memory core 24.

The command input unit 10 receives a command CMD supplied to a command terminal CMD, and outputs the received command CMD to the array control unit 20. In this embodiment, a read command, a write command, and a refresh command are supplied as the commands CMD to the command input unit 10.

The address input unit 12 receives an external address AD supplied to an address terminal AD, and outputs the received external address AD as a row address RAD (high-order address) and a column address CAD (low-order address) to the memory core 24. The external address AD indicates a memory cell MC to be accessed. The row address RAD is used to select a word line WL. The column address CAD is used to select bit lines BL, /BL. The row address RAD and the column address CAD are simultaneously supplied to the address terminal AD.

The defect detection input unit 14 operates only during an activation of a test mode signal TEST, and activates a defect detection signal FDET1 for a predetermined period of time in response to an activation of a defect detection signal FDET. The test dummy defect output unit 16 operates only during the activation of the test mode signal TEST, and activates a data inversion signal DINV for a predetermined period of time in response to the activation of the defect detection signal FDET1. In this embodiment, the data inversion signal DINV is activated, for example, in a period of four access cycles, which is previously set, as shown in later-described FIG. 3.

The data input/output unit 18 outputs read data output from the memory core 24 via a data bus DB to data terminals DT (DT0-7) in a read operation, and outputs write data received at the data terminal DT to the memory core 24 via the data bus DB in a write operation. The data terminal DT is a terminal common to the read data and the write data. The data input/output unit 18 functions as a data output unit outputting the read data and as a data input unit inputting the write data. Further, during the activation of the data inversion signal DINV, the data input/output unit 18 inverts a logic level of the read data supplied from a sense amplifier SA via the data bus DB, and outputs the inverted data to the data terminal DT.

In order to execute an access operation of the memory core 24, the array control unit 20 outputs a control signal CNT to access a cell array ARY in response to the command CMD. As a control signal CNT, there can be cited a word line control signal to select the word line WL, a sense amplifier control signal to activate the sense amplifier SA, a column switch control signal to select a column switch, a precharge control signal to precharge the bit lines BL, /BL, and the like.

The redundancy fuse circuit 22 has a row redundancy fuse circuit to switch a defective word line WL (normal word line) to a redundancy word line RWL, and a column redundancy fuse circuit to switch a defective bit line pair BL, /BL (normal bit line) to a redundancy bit line pair RBL, /RBL. A fuse of the redundancy fuse circuit 22 is programmed in a test process of the memory MEM. In accordance with the program result, a redundancy control signal RED including address information is output. When an access command CMD with respect to the word line WL (or bit line pair BL, /BL) indicated by the redundancy control signal RED is given, a selection of the word line WL (or bit line pair BL, /BL) is disabled, and the redundancy word line RWL (or redundancy bit line pair BL, /BL) is selected. Accordingly, the defect is relieved.

The memory core 24 has a row address decoder RDEC, a column address decoder CDEC, a sense amplifier SA, a column switch CSW, a read amplifier RA, a write amplifier WA, and a cell array ARY. The cell array ARY has dynamic memory cells MC and word lines WL and bit line pairs BL, /BL coupled to the dynamic memory cells MC. The memory cell MC is formed at an intersection portion of the word line WL and the bit line pair BL, /BL.

Further, the cell array ARY has redundancy memory cells RMC and redundancy word lines RWL and redundancy bit line pairs RBL, /RBL coupled to the redundancy memory cells RMC. In the drawing, the redundancy bit line pair RBL, /RBL is represented by a single signal line. The redundancy memory cell RMC is formed at an intersection portion of the redundancy word line RWL, the bit line pair BL, /BL, and the RBL, /RBL, and at an intersection portion of the redundancy bit line pair RBL, /RBL, the word line WL, and the RWL. In this embodiment, the cell array ARY has four redundancy word lines RWL (redundancy circuits) and four sets of redundancy bit line pairs RBL, /RBL (redundancy circuits), for example. Accordingly, it is possible to relieve defects (single bit defects) of eight memory cells MC, for instance. Alternatively, it is possible to relieve four word line defects and four bit line defects.

The row address decoder RDEC decodes the row address RAD from the address input unit 12 to select either of the word lines WL. The column address decoder CDEC decodes the column address CAD from the address input unit 12 to select eight sets of the bit line pairs BL, /BL corresponding to the number of bits of the data terminal DT. The sense amplifier SA amplifies a difference between signal amounts of data signal read to the bit line pair BL, /BL. The sense amplifier SA functions as a read unit to read data held in the memory cell MC. The column switch CSW couples the bit lines BL, /BL to the data bus line DB in accordance with the column address CAD.

The read amplifier RA amplifies complementary read data output via the column switch CSW in a read operation. The write amplifier WA amplifies complementary write data supplied via the data bus DB, and supplies it to the bit line pair BL, /BL in a write operation.

Figure 2:
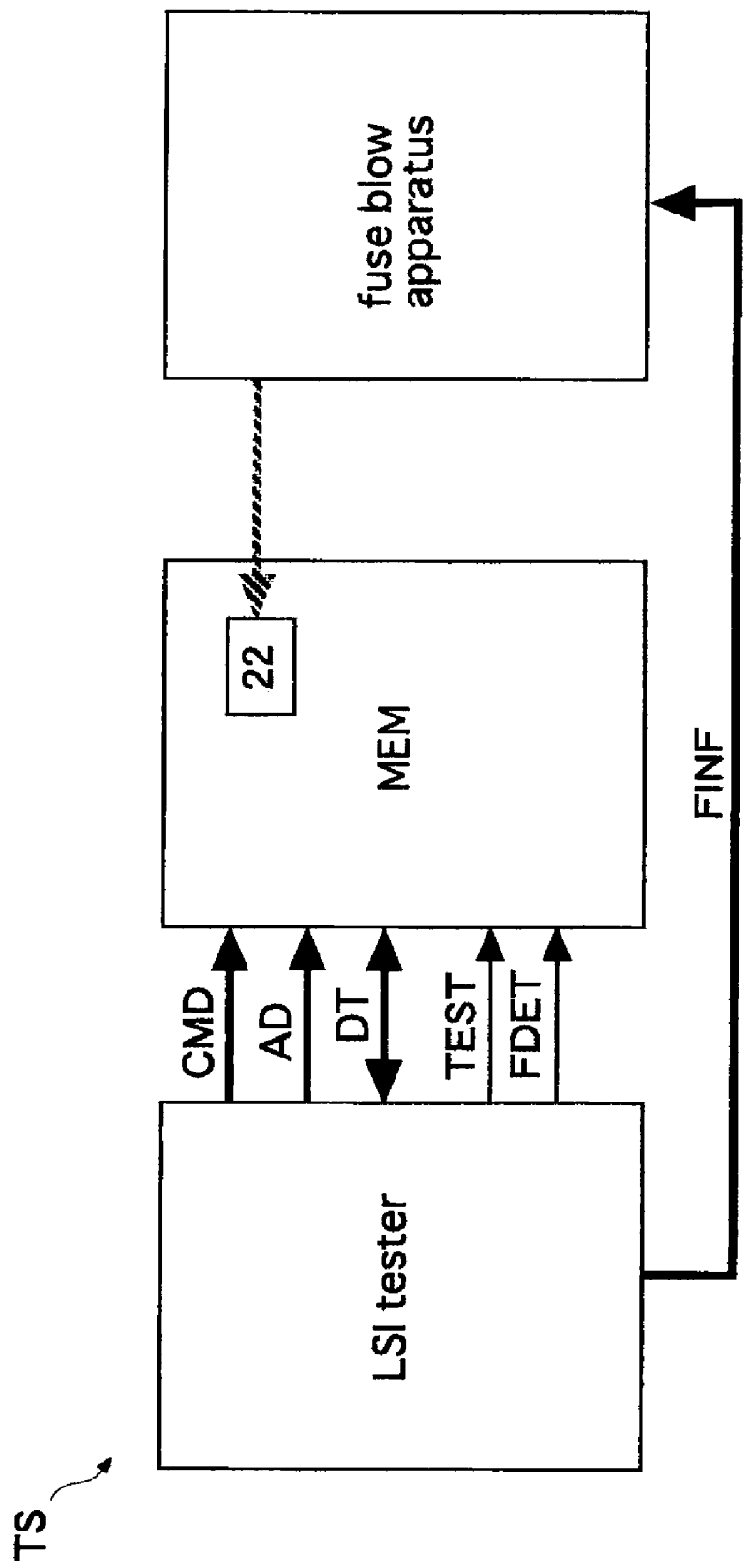
FIG. 2 illustrates a block diagram showing a test system of the first embodiment.

FIG. 2 illustrates a test system TS of the first embodiment. The test system TS includes the memory MEM shown in FIG. 1, an LSI tester testing an operation of the memory MEM, and a fuse blow apparatus programming the redundancy fuse circuit 22 of the memory MEM in accordance with the test result of the LSI tester (fuse information FINF). The fuse information FINF includes information on defect addresses and information on the redundancy word line RWL or the redundancy bit line pair RBL, /RBL to be used. For example, when the fuse information FINF includes number information on the redundancy word line RWL, the defect is relieved by using the redundancy word line RWL corresponding to the number. When the fuse information FINF includes number information on the redundancy bit line pair RBL, /RBL, the defect is relieved by using the redundancy bit line pair RBL, /RBL corresponding to the number.

The LSI tester activates the test mode signal TEST while executing a specific operational test. The LSI tester activates the defect detection signal FDET upon detecting a defect of the memory cell MC during the specific operational test. According to the activation, the memory MEM forcibly inverts the logic level of the read data to be output to the data terminal DT, as shown in later-described FIG. 3. Namely, the memory MEM artificially makes a normal memory cell MC defective.

Figure 3:
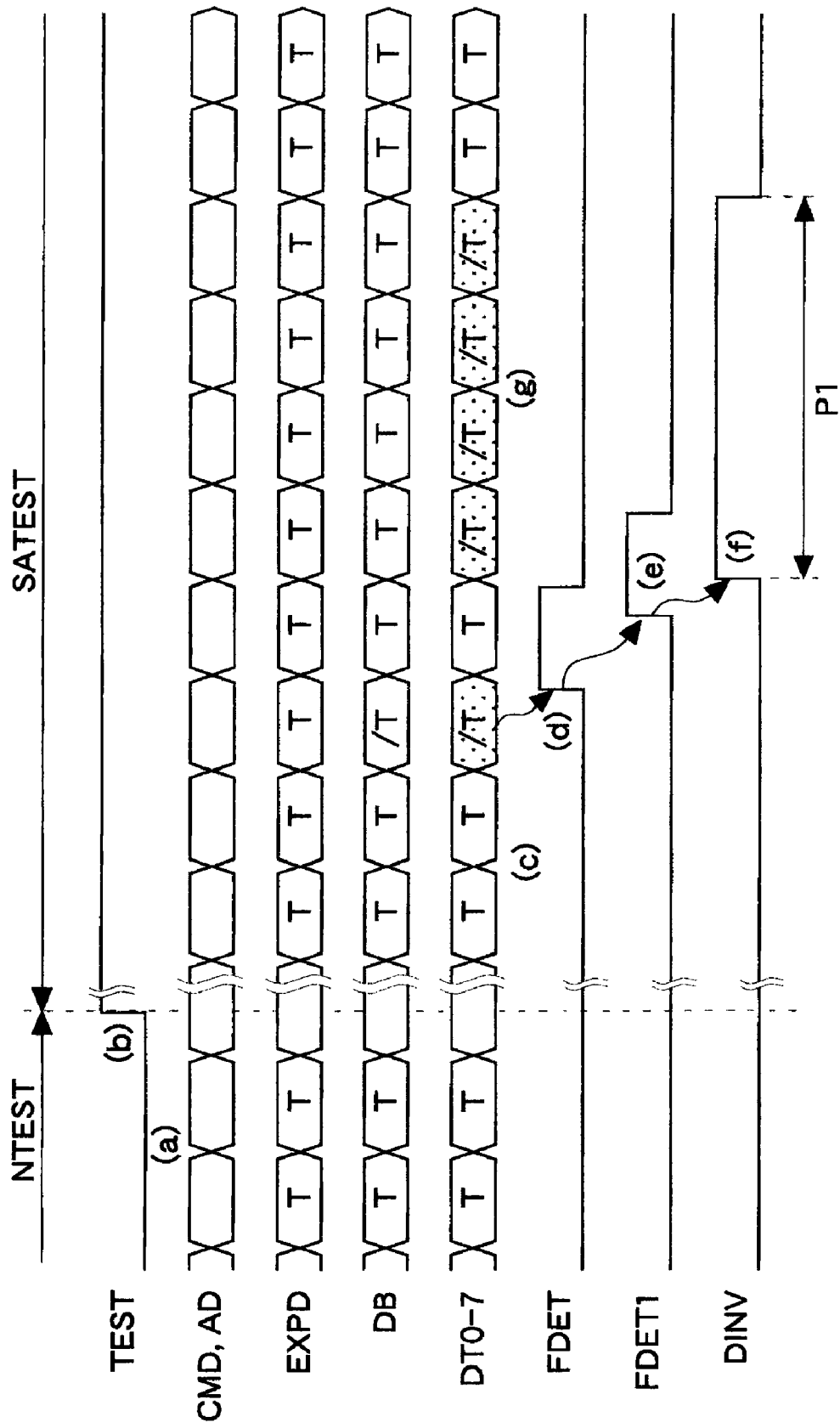
FIG. 3 illustrates a timing chart showing an operation test method of the memory according.

FIG. 3 illustrates an operation test method of the memory MEM according to the first embodiment. In this example, the LSI tester shown in FIG. 2 executes a normal test NTEST to detect a defect, and thereafter, it activates the test mode signal TEST at a high level and executes an operation margin test SATEST of the sense amplifier SA. Here, the normal test is executed by using, for instance, a marching pattern to detect a solid defect which does not depend on a voltage or a timing. "T" and "/T" in read data DT0-7 in the drawing respectively indicate a logic value of certain data and a logic value in which the logic of the data is inverted. The operation test is executed by using, for example, a semiconductor wafer having a plurality of memories MEM formed thereon.

During the period of normal test NTEST, the LSI tester sequentially supplies the commands CMD and the addresses AD to the memory MEM to get write access to the memory MEM, sequentially reads read data DT by getting read access to the memory MEM, and compares the read data DT with an expected value (write data) (FIG. 3 (a)). Note that the write data is previously written into the memory MEM ahead of the period shown in the drawing.

Next, the LSI tester activates the test mode signal TEST to execute the operation margin test SATEST (FIG. 3(b)). Subsequently, after getting write access to the memory MEM, the LSI tester sequentially reads the read data DT by getting read access to the memory MEM, and compares the read data output from the data input/output unit 18 with expected value data EXPD (write data) (FIG. 3(c)). In this example, to evaluate the operation margin of the sense amplifier SA, the LSI tester supplies the same column address (CAD) to the memory MEM during the operation margin test SATEST. The LSI tester detects a defect of the memory cell MC by reading erroneous data (/T) being different from the expected value EXPD (T) at the time of the third read operation, and activates the defect detection signal FDET at a high level (FIG. 3(d)). Information on the defect of the memory cell MC in which the defect is detected (address AD, the number of data terminal DT, and the like) is held in the LSI tester.

The defect detection input unit 14 of the memory MEM activates the defect detection signal FDET1 at a high level in response to the activation of the defect detection signal FDET (FIG. 3(e)). The dummy defect output unit 16 of the memory MEM activates the data inversion signal DINV at a high level in response to the activation of the defect detection signal FDET1 (FIG. 3(f)). The period of activation of the data inversion signal DINV is equivalent to, for example, a period P1 corresponding to four access cycles, and the number of access cycles (four times) executed during the period P1 is equivalent to the number of redundancy word lines RWL.

The data input/output unit 18 inverts a logic level of read data T supplied via the data bus DB, and outputs it as inversion data /T to the data terminal DT during the activation of the data inversion signal DINV (FIG. 3(g)). The inversion data /T is output four times. Accordingly, the LSI tester detects, on the same column address CAD, the single bit defects whose number is larger by one than the number of redundancy word lines RWL. The LSI tester determines that these defects cannot be relieved by one redundancy word line RWL, but can be relieved by one redundancy bit line pair RBL, /RBL Namely, by generating artificial defects whose number is equal to or larger than the number of redundancy word lines RWL using the memory MEM, it becomes possible to relieve the defects by using a desired redundancy bit line pair RBL, /RBL or redundancy word line RWL without changing the LSI tester and the test program.

The LSI tester transfers defect addresses and information indicating the use of the redundancy bit line pair RBL, /RBL as fuse information FINF to the fuse blow apparatus. The fuse blow apparatus programs the redundancy fuse circuit 22 according to the fuse information FINF received from the LSI tester. Therefore, when the operation margin of the sense amplifier SA is insufficient and the single bit defects are sporadically generated, it is possible to relieve the defects by using the redundancy bit line pair RBL, BL without changing the test environment, and to stop the use of the sense amplifier SA which causes the defects. As a result of this, the relief efficiency can be enhanced. Further, it is possible that the memory MEM whose defect is relieved is prevented from becoming defective on the market due to the insufficiency of the operation margin of the sense amplifier SA. In other words, a reliability of the memory MEM can be improved.

Figure 4:
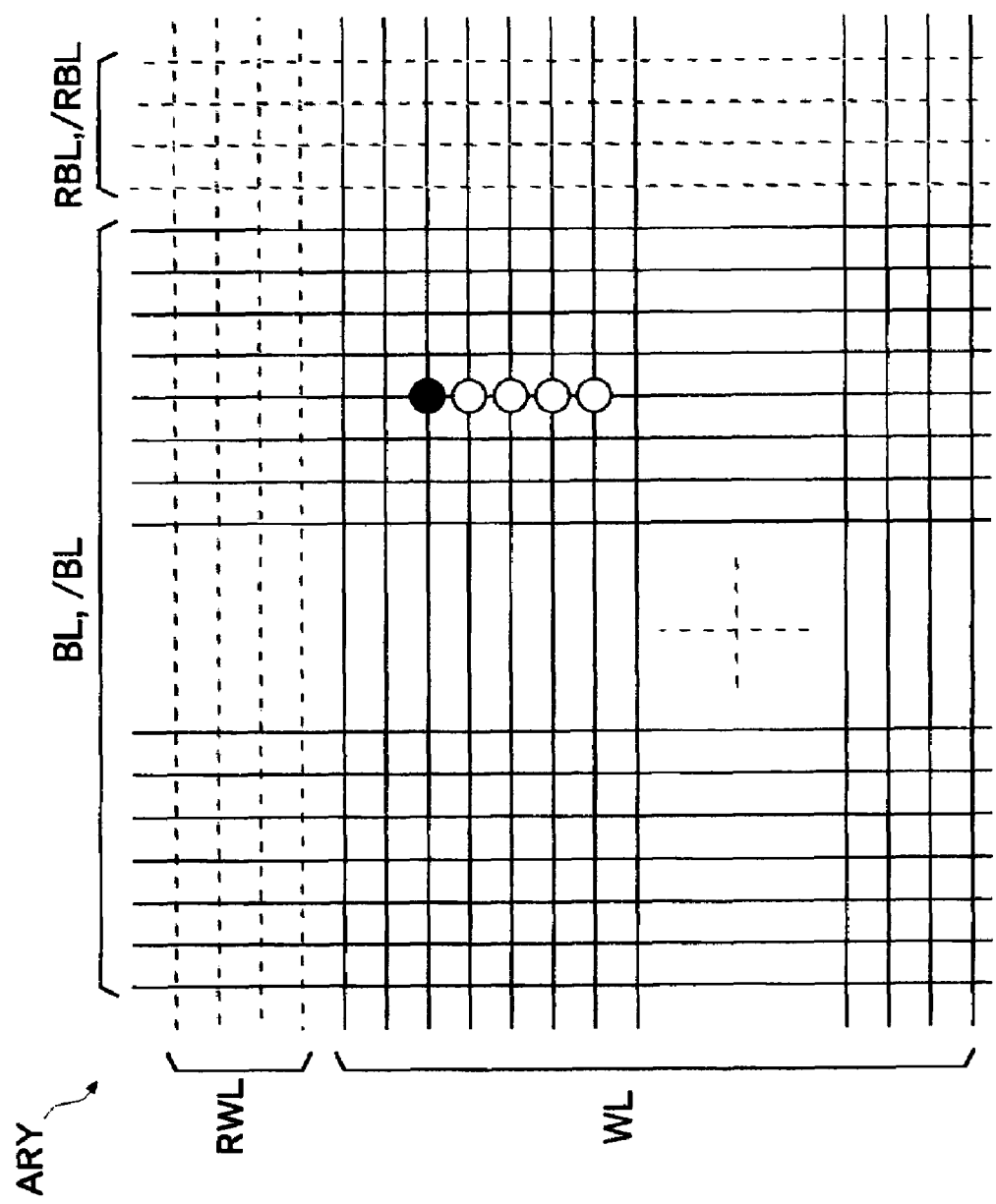
FIG. 4 illustrates an explanatory view showing a state of a cell array in an operation margin test shown in FIG. 3.

FIG. 4 illustrates a state of the cell array ARY in the operation margin test SATEST shown in FIG. 3. The bit line pair BL, /BL and the redundancy bit line pair RBL, /RBL are respectively represented by a single signal line. Further, the bit line pair BL, /BL and the redundancy bit line pair RBL, /RBL indicate only a bit DT0, for example. Upon receiving the generation of a bit defect (black circle in the drawing) from the LSI tester (FDET), the memory MEM forcibly inverts a logic level of read data of four bits following the defective bit (white circles in the drawing). Specifically, the memory MEM artificially makes the memory cells MC which operate normally defective, using a function of itself. In other words, it is possible to replace the single bit defects caused by the sense amplifier SA with the bit line defects without improving a conventional LSI tester and test program. Accordingly, as explained in FIG. 3, the LSI tester determines the use of redundancy bit line pair RBL, /RBL to relieve the generated defects at a time. As a result of this, the relief efficiency can be improved.

As just described, in the first embodiment, it is possible to generate the artificial defects without changing the LSI tester or the test program executed by the LSI tester. Specifically, it is possible to replace the single bit defects with the desired bit line defects or word line defects without changing the test environment, which enables to enhance the relief efficiency.

Figure 5:
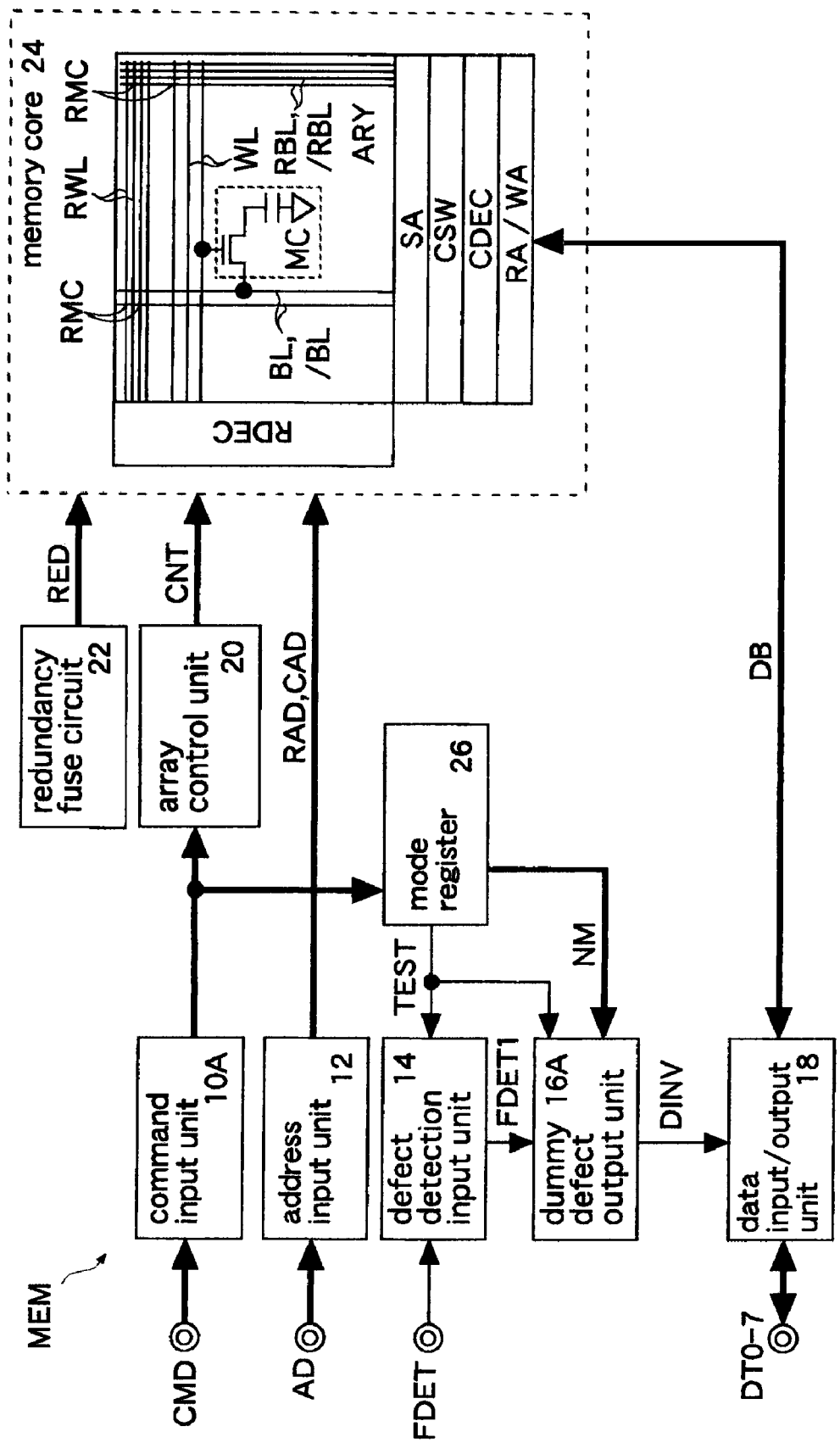
FIG. 5 illustrates a block diagram showing a semiconductor memory according to a second embodiment.

FIG. 5 illustrates a semiconductor memory according to a second embodiment. The same numerals and symbols will be used to designate the same elements as those described in the first embodiment, and the detailed description thereof will be omitted. The semiconductor memory MEM of this embodiment has a command input unit 10A and a dummy defect output unit 16A in place of the command input unit 10 and the dummy defect output unit 16 of the first embodiment. Further, the semiconductor memory MEM has a mode register 26. The other configuration is the same as that of the first embodiment. Namely, the semiconductor memory MEM is formed as a DRAM.

The command input unit 10A has a function of receiving a mode register set command via the command terminal CMD in addition to the function of the command input unit 10 of the first embodiment. The mode register 26 sets a plurality of kinds of operation modes to operate the memory MEM in accordance with the external address AD or the data DT supplied together with the mode register set command. The mode register 26 activates the test mode signal TEST when the mode register set command indicates a test mode command. The mode register 26 inactivates the test mode signal TEST when the mode register set command indicates a test mode release command. Further, the mode register 26 stores, when the mode register set command indicates a defect output set command, a value received at the address terminal AD or the data terminal DT as an access number NM indicating the number of accessing the cell array ARY. The mode register 26 outputs an access number signal NM indicating the stored access number NM. As the access number NM, the number equal to or larger than the number of redundancy word lines RWL or redundancy bit line pairs RBL, /RBL (specifically, "4" or larger, for example) is stored.

The dummy defect output unit 16A has a counter counting the number of access cycles. Information indicating the access cycle is output from, for instance, the array control unit. The counter starts its operation in response to the defect detection signal FDET1. The dummy defect output unit 16A activates, after receiving the defect detection signal FDET1, the data inversion signal DINV during a period where a counter value of the counter reaches the access number NM. As such, in this embodiment, the memory MEM shifts to the test mode according to the setting of the mode register 26, and inverts the logic level of the data DT during a period corresponding to the access number NM set in the mode register 26.

As just described, also in the second embodiment, the same effect as in the above first embodiment can be obtained. Further, in this embodiment, it is possible to change the access number NM indicating the period of inverting the logic level of the data DT in accordance with the test program of the LSI tester which executes the operation test of the memory MEM. Accordingly, it is possible to replace the single bit defects caused by the sense amplifier SA to the line defects without changing the test program of the LSI tester.

Figure 6:
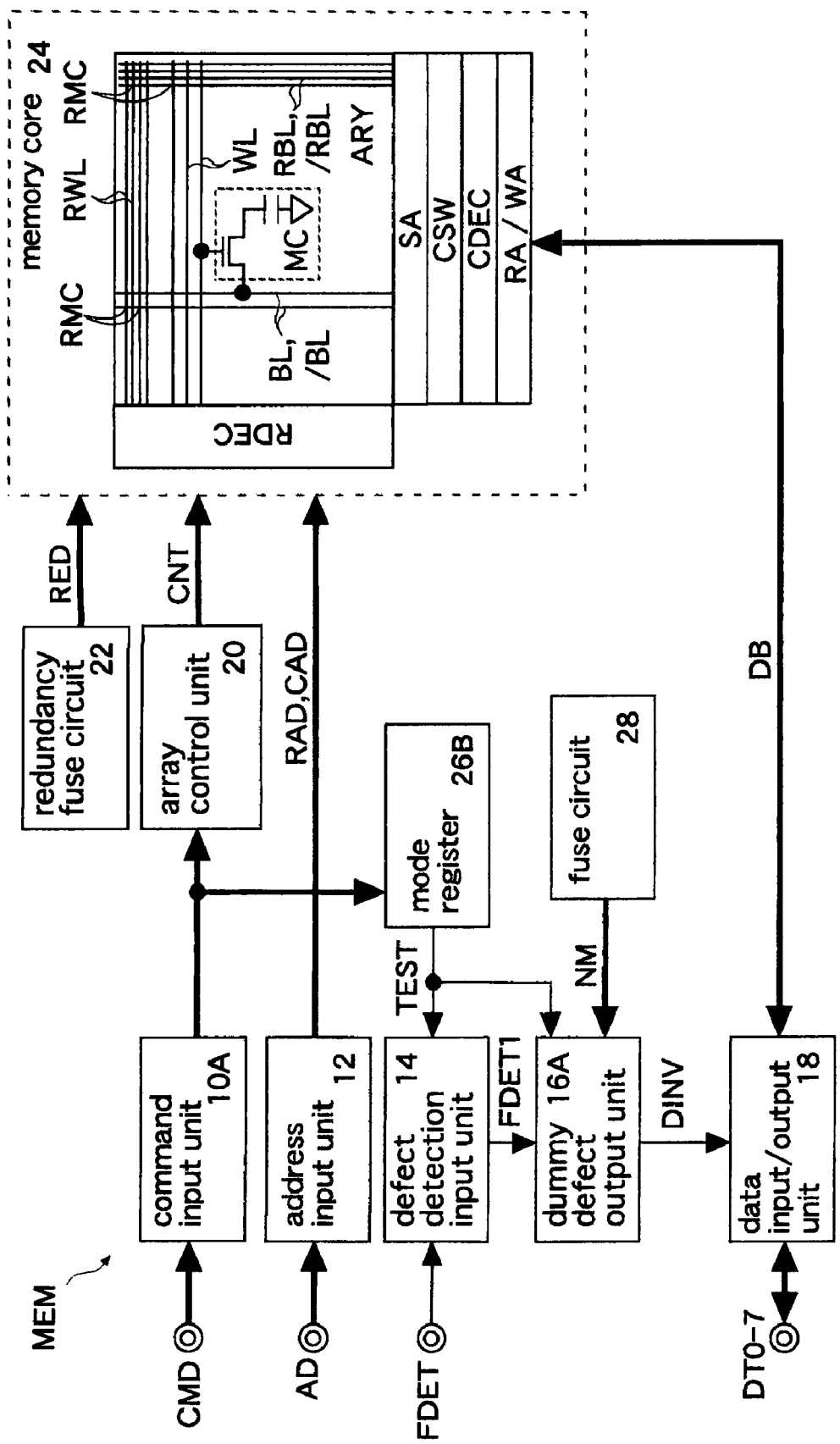
FIG. 6 illustrates a block diagram showing a semiconductor memory according to a third embodiment.

FIG. 6 illustrates a semiconductor memory according to a third embodiment. The same numerals and symbols will be used to designate the same elements as those described in the first and second embodiments, and the detailed description thereof will be omitted. The semiconductor memory MEM of this embodiment has a mode register 26B in place of the mode register 26 of the second embodiment. Further, the semiconductor memory MEM has the dummy defect output unit 16A of the second embodiment and a fuse circuit 28. The other configuration is the same as that of the first embodiment. Namely, the semiconductor memory MEM is formed as a DRAM.

The mode register 26B is configured in the same manner as the mode register 26 of the second embodiment except the function of storing the access number NM and the function of outputting the access number signal NM. The fuse circuit 28 outputs an access number signal NM indicating a value corresponding to the programmed state of a fuse being included therein. As such, the fuse circuit 28 functions as a number hold circuit to store the access number NM indicating the number of accessing the cell array ARY. For example, the fuse circuit 28 outputs the access number signal NM indicating "four times" under the state where the fuse is not blown, and it outputs the access number signal NM indicating "0 (zero) time" after the fuse is blown. The fuse of the fuse circuit 28 is blown after the redundancy fuse circuit 22 is programmed. Since the data input/output unit 18 has an input buffer and an output buffer at every data terminal DT, a power noise tends to be generated. In the present embodiment, it is possible to prevent the logic level of the data DT from being mistakenly inverted due to a malfunction and the like of the data input/output unit 18, after the operation test is executed.

As just described, also in the third embodiment, the same effect as in the above first embodiment can be obtained. Further, in this embodiment, it is possible to prevent the malfunction of the memory MEM after the operation test is executed and the memory MEM is shipped.

Figure 7:
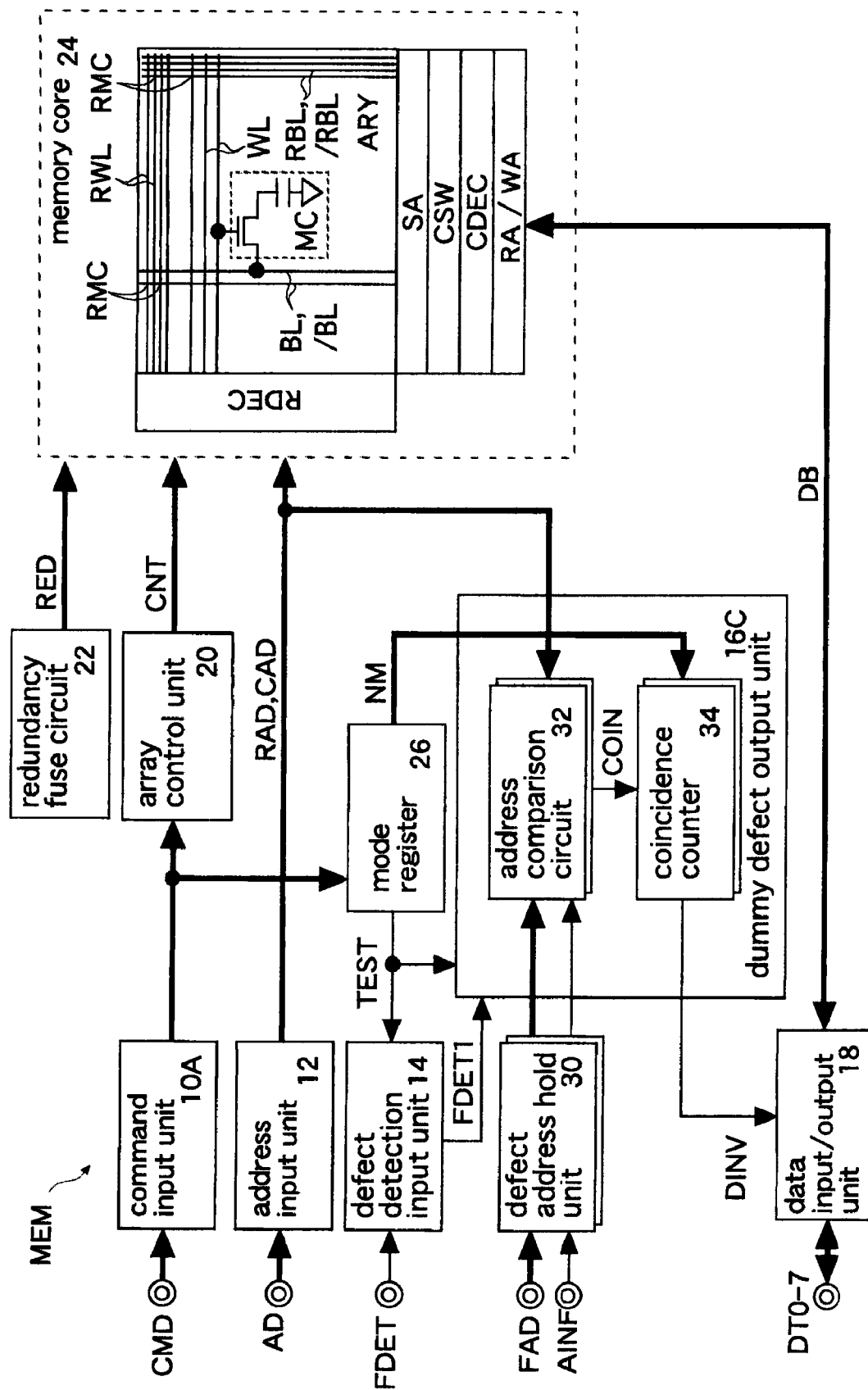
FIG. 7 illustrates a block diagram showing a semiconductor memory according to a fourth embodiment.

FIG. 7 illustrates a semiconductor memory according to a fourth embodiment. The same numerals and symbols will be used to designate the same elements as those described in the first and second embodiments, and the detailed description thereof will be omitted. The semiconductor memory MEM of this embodiment has a dummy defect output unit 16C in place of the dummy defect output unit 16 of the second embodiment. Further, the semiconductor memory MEM newly has a defect address hold unit 30. The other configuration is the same as that of the second embodiment. Namely, the semiconductor memory MEM is formed as a DRAM.

The defect address hold unit 30 receives a defect address FAD and address information AINF via external terminals FAD and AINF, and holds the received defect address FAD and address information AINF. For example, the defect address FAD and the address information AINF are supplied from the LSI tester which tests the memory MEM. The LSI tester outputs the row address RAD or the column address CAD indicating the defective memory cell MC as the defect address FAD, and outputs the address information AINF indicating that the defect address FAD is either the row address RAD or the column address CAD. For instance, the defect address FAD is the row address RAD when the address information AINF is at a high logic level, and it is the column address CAD when the address information AINF is at a low logic level. Note that to hold a plurality of sets of defect addresses FAD and address information AINF, the defect address hold unit 30 has a plurality of hold circuits. In order to illustrate the plurality of hold circuits, frames surrounding the defect address hold unit 30 are overlapped in the drawing.

The dummy defect output unit 16C has an address comparison circuit 32 and a coincidence counter 34. When the address information AINF indicates the row address, namely, when the defect address FAD indicates the word line WL, the address comparison circuit 32 compares the defect address FAD with the row address RAD supplied to the memory core 24. Further, when the address information AINF indicates the column address, namely, when the defect address FAD indicates the bit line pair BL, /BL, the address comparison circuit 32 compares the defect address FAD with the column address CAD supplied to the memory core 24.

In this embodiment, since the defect address FAD is supplied together with the address information AINF, it is possible to reduce the number of defect address terminals FAD. Further, it is possible to reduce the number of bits of address compared in the address comparison circuit 32. Since the number of terminals and a circuit scale can be reduced, a chip size of the memory MEM can be reduced.

Upon detecting a coincidence between the access address and the defect address FAD, the address comparison circuit 32 outputs a coincidence signal COIN (positive pulse signal, for instance). Note that the address comparison circuit 32 has a plurality of comparators in order to compare the plurality of defect addresses FAD with the access address. Accordingly, the coincidence signal COIN is output by each of the plurality of defect addresses FAD.

The coincidence counter 34 counts the number of outputs of the coincidence signal COIN (number of coincidences detected in the address comparison circuit 32), and activates the data inversion signal DINV in synchronization with the coincidence signal COIN each time the defect address FAD is accessed, until the number of outputs of the coincidence signal COIN reaches the access number NM set in the mode register 26. In this embodiment, the access number NM is equivalent to the number of redundancy word lines RWL or redundancy bit line pairs RBL, /RBL, which is "4", for instance.

Note that, in order to count the coincidence signals COIN each corresponding to the plurality of defect addresses FAD, the coincidence counter 34 has a plurality of sub-counters and an OR circuit to receive outputs of the sub-counters. The OR circuit activates the data inversion signal DINV when either of the sub-counters counts the access number NM. The dummy defect output unit 16C starts its operation in response to the activation of the defect detection signal FDET1, and when counter values of all the sub-counters reach the access number NM, it stops the operation in response to the activation of the data inversion signal DINV, and is reset.

In this embodiment, the logic of the read data is inverted only when, after the defective memory cell MC (single bit defect) is detected by the LSI tester or the like, the address AD indicating the word line WL or the bit lines BL, /BL to which the defective memory cell MC is coupled coincides with the defect address FAD. For example, in the operation margin test of the sense amplifier SA, the plurality of bit line pairs BL, /BL may be accessed at intervals. Even in this case, the logic of the read data corresponding to the defective bit line is inverted until the access number with respect to the bit line pair BL, /BL (defective bit line) coupled to the defective memory cell MC reaches larger than the number of redundancy word lines RWL.

Further, since there are provided the plurality of hold circuits, comparators and sub-counters, it is possible to replace each of the defects (single bit defects) of the plurality of memory cells MC with the bit line defect or the word line defect. It is also possible that the bit line defects and the word line defects are mixed to be artificially detected in accordance with the address information AINF. Therefore, the single bit defects generated at a plurality of points in the cell array ARY can be relieved by using any redundancy bit line pairs RBL, /RBL, or redundancy word lines RWL.

Figure 8:
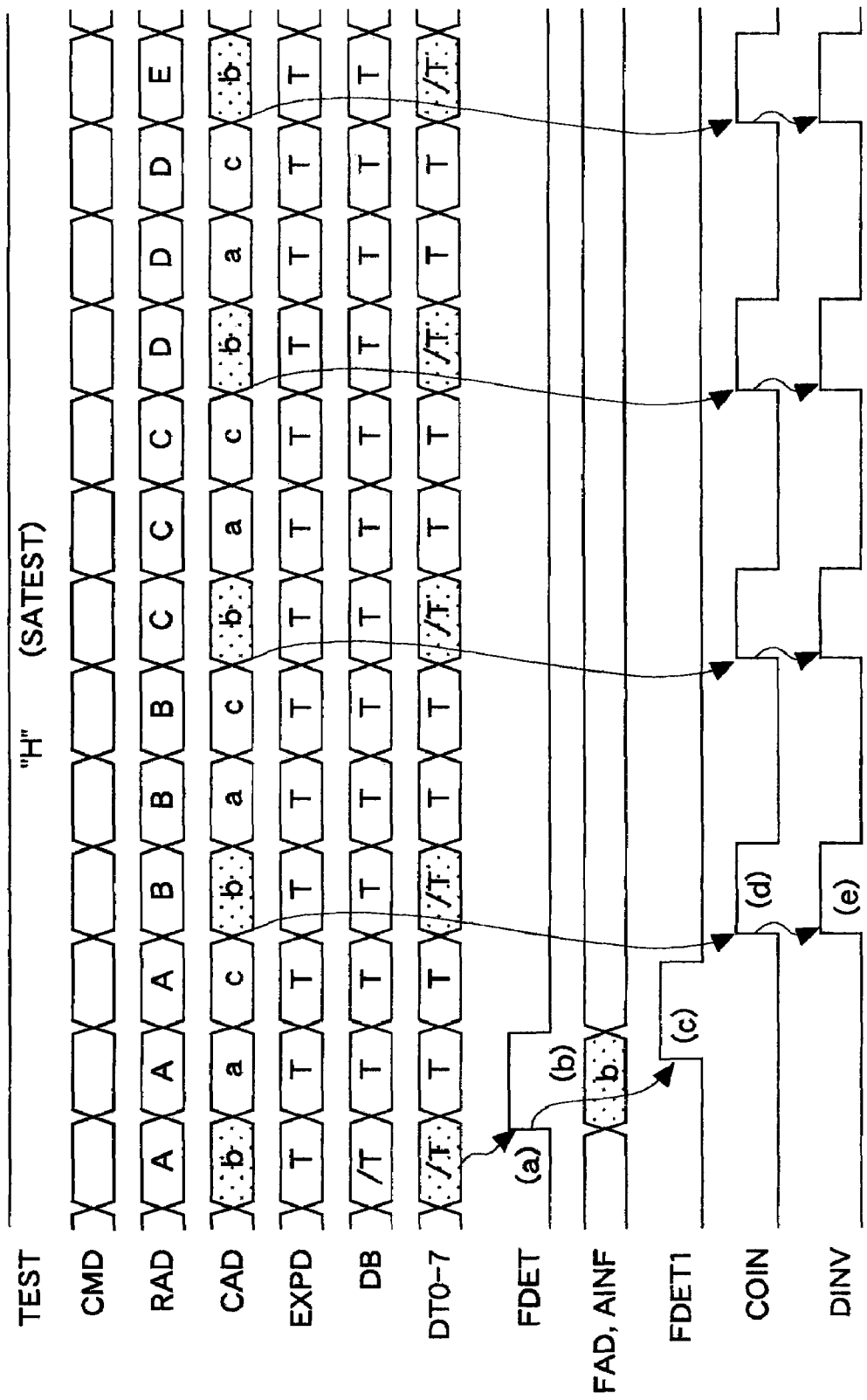
FIG. 8 illustrates a timing chart showing an operation test method of the memory according to the fourth embodiment.

FIG. 8 illustrates an operation test method of the memory MEM according to the fourth embodiment. Regarding the same operation as that described in FIG. 3, the detailed description will be omitted. This example shows a state in the middle of the operation margin test SATEST of the sense amplifier SA. For this reason, the test mode signal TEST is kept at a high logic level. The test data is previously written into the memory MEM.

For example, the operation margin test SATEST is executed by sequentially shifting to the row addresses RAD (A, B, C, D, and E) while repeatedly accessing the column addresses CAD (a, b, and c) being adjacent to one another. The LSI tester detects a defect of the memory cell MC in which the row address RAD is A, and the column address CAD is b, and activates the defect detection signal FDET at a high level (FIG. 8(a)). Further, the LSI tester outputs the defect address FAD and the address information AINF in synchronization with the activation of the defect detection signal FDET (FIG. 8(b)). Here, the defect address FAD is the column address CAD (=b), and the address information AINF indicates the column address. The defect address FAD and the address information AINF are supplied to the address comparison circuit 32 of the memory MEM.

The defect detection input unit 14 of the memory MEM activates the defect detection signal FDET1 in response to the activation of the defect detection signal FDET, similarly as in FIG. 3 (FIG. 8(c)). The dummy defect output unit 16C of the memory MEM activates, when an access to the column address CAD of "b" is detected, the coincidence signal COIN in response to the activation of the defect detection signal FDET1 (FIG. 8(d)). During the activation of the data inversion signal DINV, the data input/output unit 18 inverts the logic level of the read data T supplied via the data bus DB, and outputs it as inversion data /T to the data terminal DT (FIG. 8(e)). The coincidence signal COIN is output by a number of times indicated by the access number signal NM output from the mode register 26. As a result of this, the logic level of the read data is inverted, for example, four times at maximum. Accordingly, the LSI tester detects the defects of five memory cells MC coupled to the same bit line pair BL, /BL, and determines that the redundancy using the redundancy bit line pair RBL, /RBL is needed.

Figure 9:
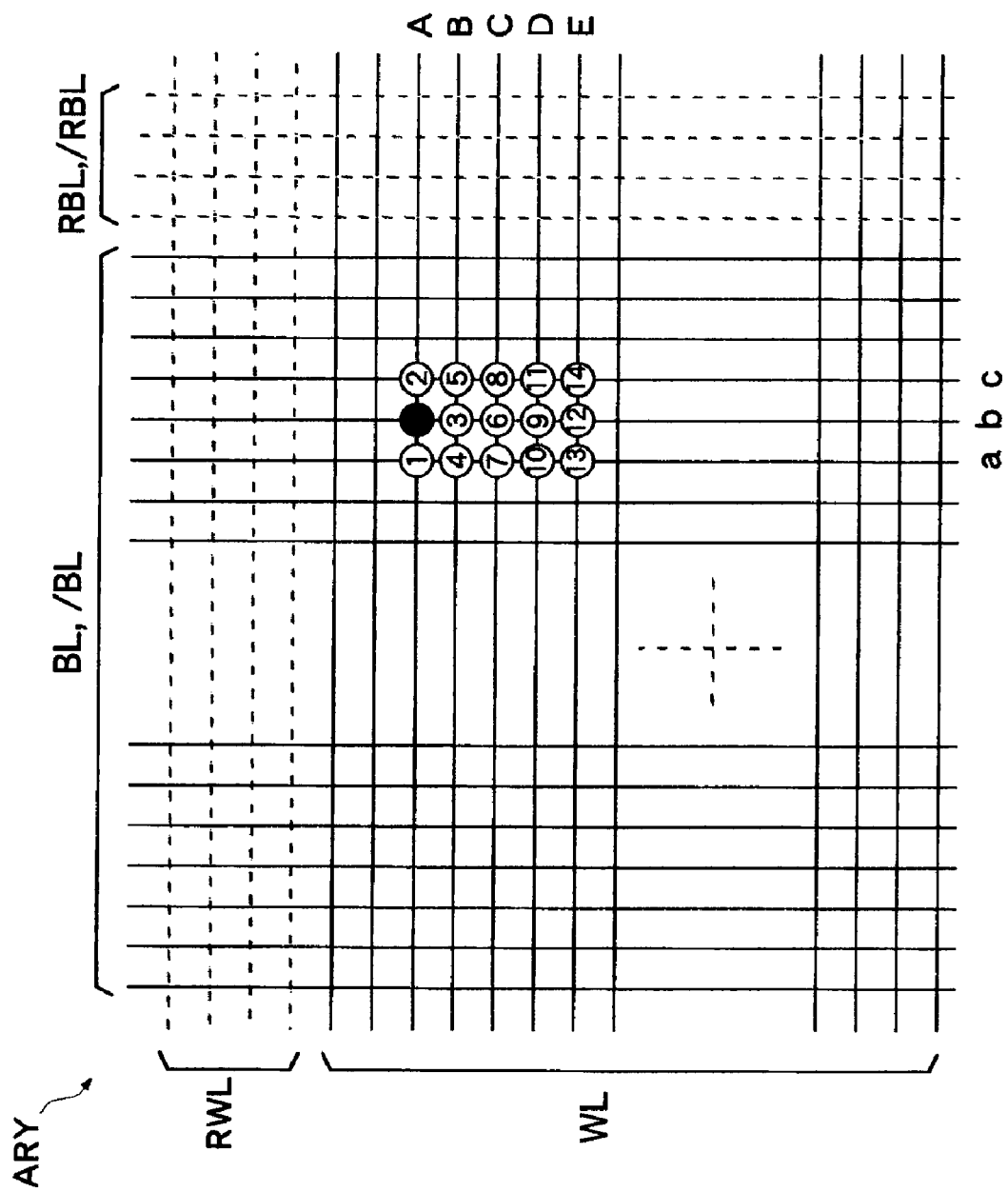
FIG. 9 illustrates an explanatory view showing a state of a cell array in an operation margin test shown in FIG. 8.

FIG. 9 illustrates a state of the cell array ARY in the operation margin test SATEST shown in FIG. 8. Figures in the drawing have the same meaning as in the aforementioned FIG. 4. Reference numerals a, b, and c coupled to the bit line pairs BL, /BL indicate the column addresses CAD shown in FIG. 8. Reference numerals A, B, C, D, and E coupled to the word lines WL indicate the row addresses RAD shown in FIG. 8. Numerals in the white circles indicate an order of the memory cells MC to be accessed by the LSI tester after receiving the generation of the bit defect (black circle in the drawing) from the LSI tester. In this example, the memory MEM inverts, until the access to the bit line pair BL, /BL coupled to the defective memory cell MC (black circle) is executed four times (third, sixth, ninth, and twelfth accesses) the logic of the read data each time the access is executed.

As just described, also in the fourth embodiment, the same effect as in the above first embodiment can be obtained. Further, in this embodiment, it is possible to generate the artificial defect by targeting only the bit line pair BL, /BL or the word line WL coupled to the memory cell MC in which the defect is detected. Therefore, even when the test is executed by accessing a plurality of bit line pairs BL, /BL or a plurality of word lines WL at intervals, the LSI tester can determine the defect of the bit line pair BL, /BL or the defect of the word line WL coupled to the defective memory cell MC.

Figure 10:
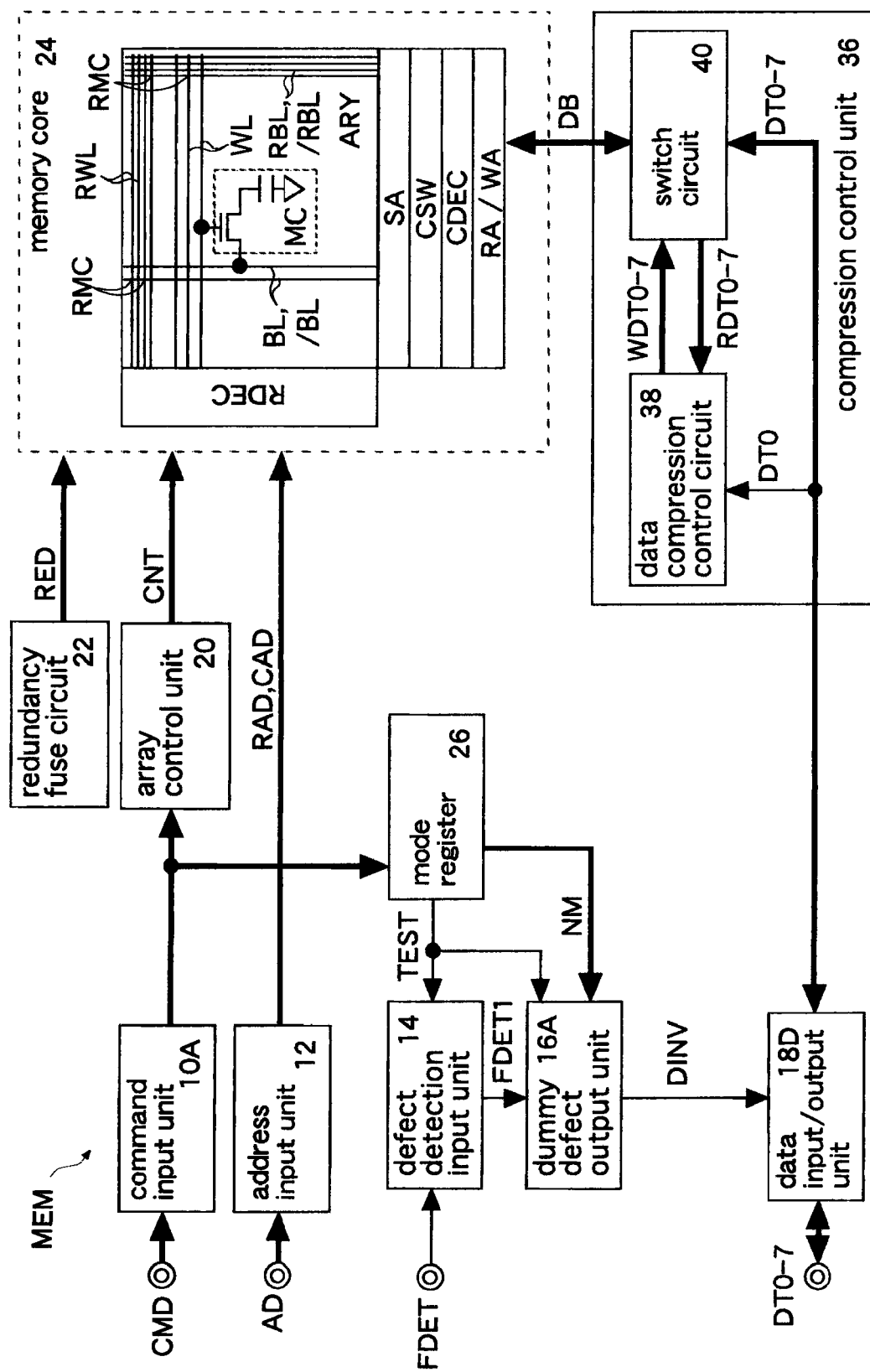
FIG. 10 illustrates a block diagram showing a semiconductor memory according to a fifth embodiment.

FIG. 10 illustrates a semiconductor memory according to a fifth embodiment. The same numerals and symbols will be used to designate the same elements as those described in the first and second embodiments, and the detailed description thereof will be omitted. The semiconductor memory MEM of this embodiment has a data input/output unit 18D in place of the data input/output unit 18 of the second embodiment. Further, the semiconductor memory MEM has a compression control unit 36 between the memory core 24 and the data input/output unit 18. The other configuration is the same as that of the second embodiment. Namely, the semiconductor memory MEM is formed as a DRAM.

The compression control unit 36 has a data compression control circuit 38 receiving data DT0 of one bit from the data input/output unit 18, and a switch circuit 40 receiving data DT0-7 of eight bits from the data input/output unit 18. The data compression control circuit 38 operates only during a data compression test mode. The memory MEM shifts from a normal operation mode to the data compression test mode when a bit corresponding to the mode register 26 is set by the test command, and it returns from the data compression test mode to the normal operation mode when the bit corresponding to the mode register 26 is reset. The data compression control circuit 38 distributes the write data received at the data terminal DT0 to write data WDT0-7 of eight bits. The write data WDT0-7 each having the same logic are written into the memory cell MC corresponding thereto via the switch circuit 40. Further, the data compression control circuit 38 compares coincidence/non-coincidence of bit values of read data RDT (eight bits) output from the switch circuit 40, and when all the bit values are the same, it outputs a low logic level to the data terminal DT0 (no defect exists), and when the bit values are different from one another, it outputs a high logic level to the data terminal DT0 (defect exists).

The switch circuit 40 inputs/outputs the data DT0-7 via the data compression control circuit 38 during the data compression test mode, and it directly inputs/outputs the data DT0-7 to the data bus DB during the normal operation mode. During the data compression test mode, the LSI tester or the like outputs the write data only to the data terminal DT0, and receives a test result therefrom. The LSI tester determines that there is no defect when the data DT0 of low logic level is output as the test result, and it determines that there exists a defect when the data DT0 of high logic level is output as the test result. In the data compression test, the test can be carried out with respect to the data of eight bits using one data terminal DT0. Accordingly, it is possible to execute the test by mounting a large number of memories MEM on a test board, which enables to reduce the test cost.

Upon receiving the activation of the data inversion signal DINV during the test in the normal operation mode, the data input/output unit 18D inverts the logic level of the read data DT0-7 and outputs to the data terminals DT0-7. Specifically, the operation during the test in the normal operation mode is the same as that of the second embodiment. Upon receiving the activation of the data inversion signal DINV during the data compression test mode, the data input/output unit 18D outputs the high logic level to the data terminal DT0 regardless of the test result. Namely, the data input/output unit 18D inverts the logic indicating the coincidence and outputs it during the activation of the data inversion signal DINV. Accordingly, it is possible to forcibly output the defect information from the memory MEM not only in the normal test but also in the data compression test. As a result of this, the LSI tester or the like testing the memory MEM can select the optimum line between the redundancy word line RWL and the redundancy bit line pair RBL, /RBL according to the operation margin evaluated in the test program.

As just described, also in the fifth embodiment, the same effect as in the above first and second embodiments can be obtained. Further, in this embodiment, also in the memory MEM having the data compression test function, it is possible to replace the single bit defect caused by the operation margin in a specific circuit in the memory MEM with the word line defect or the bit line defect without changing the test program of the LSI tester.

Figure 11:
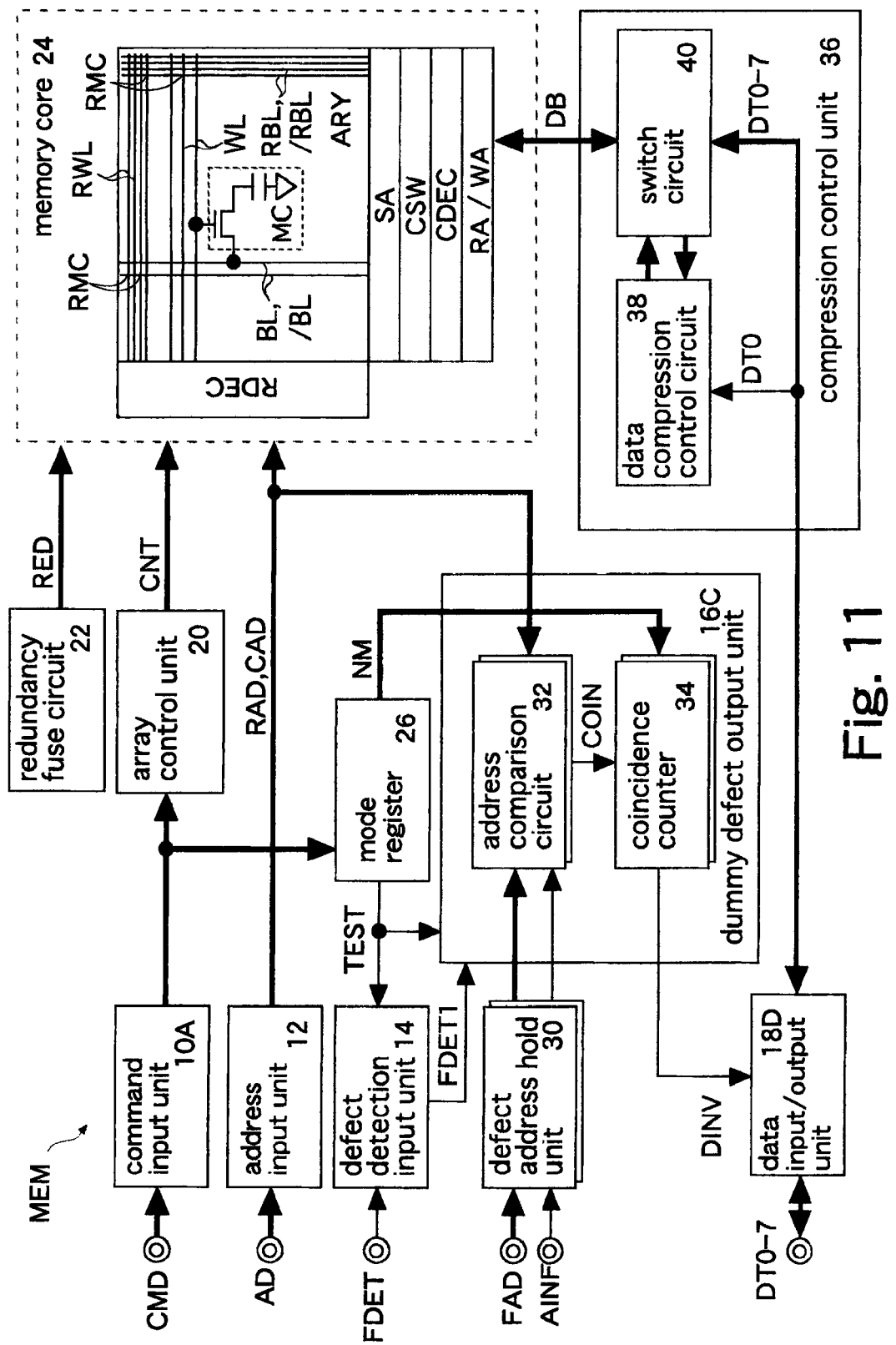
FIG. 11 illustrates a block diagram showing a semiconductor memory according to a sixth embodiment.

FIG. 11 illustrates a semiconductor memory according to a sixth embodiment. The same numerals and symbols will be used to designate the same elements as those described in the first, fourth, and fifth embodiments, and the detailed description thereof will be omitted. The semiconductor memory MEM of this embodiment has a data input/output unit 18D in place of the data input/output unit 18 of the fourth embodiment. Further, the semiconductor memory MEM has a compression control unit 36 between the memory core 24 and the data input/output unit 18D. The other configuration is the same as that of the fourth embodiment. Namely, the semiconductor memory MEM is formed as a DRAM.

In this embodiment, during the test in the normal operation mode, after the single bit defect of the memory cell MC is detected, the logic of the read data is inverted by a number of times indicated by the access number signal NM each time the memory cell MC coupled to the same bit lines BL, /BL to which the memory cell MC having the defect is coupled is accessed, similarly as in the fourth embodiment. In the data compression test mode, after the single bit defect of the memory cell MC is detected, the logic level indicating the defect (=high logic level) is output by a number of times being equal to the access number NM from the data terminal DT0 each time the memory cell MC coupled to the same bit lines BL, /BL to which the memory cell MC having the defect is coupled is accessed. As just described, also in the sixth embodiment, the same effect as in the above first, fourth and fifth embodiments can be obtained.

Figure 12:
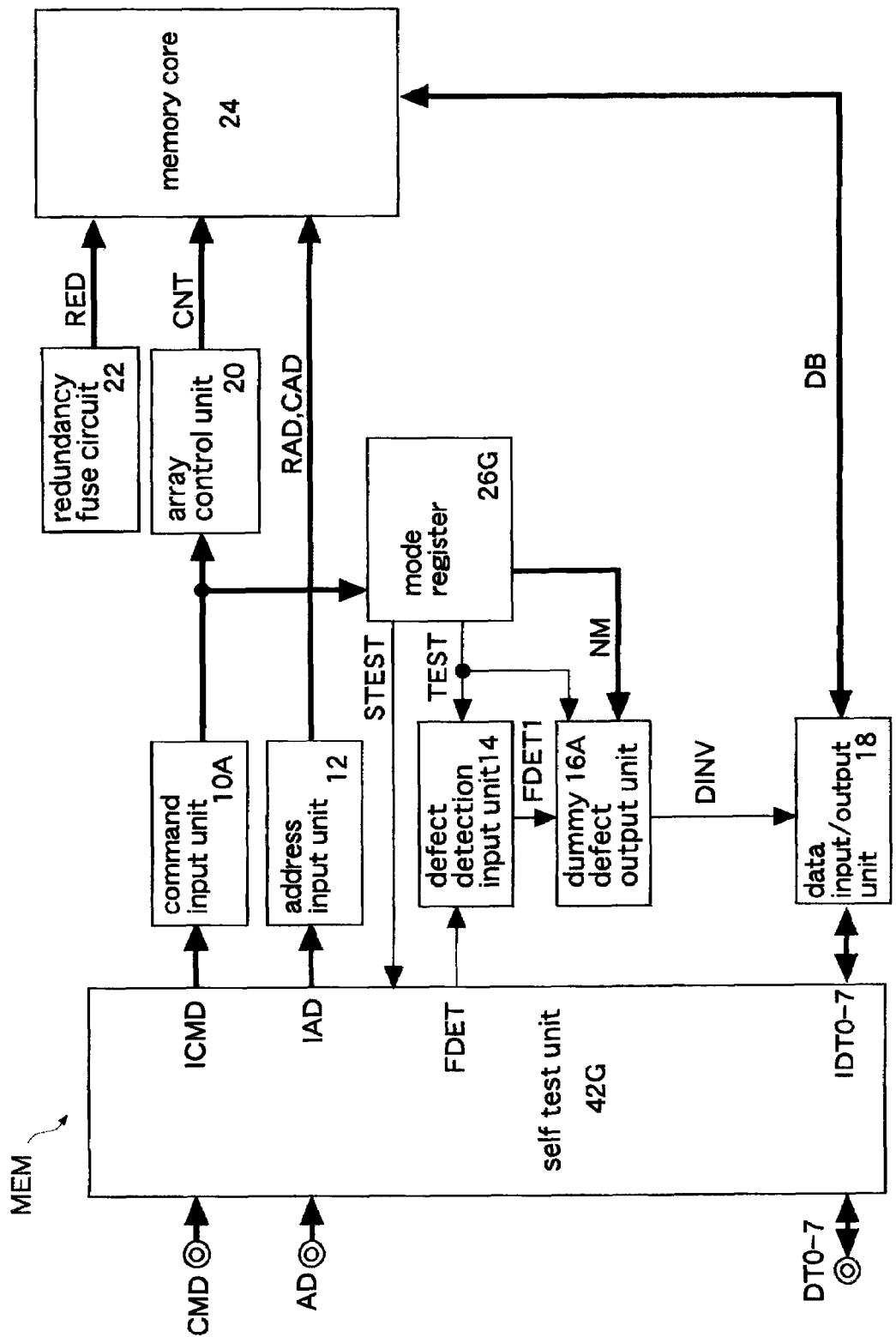
FIG. 12 illustrates a block diagram showing a semiconductor memory according to a seventh embodiment.

FIG. 12 illustrates a semiconductor memory according to a seventh embodiment. The same numerals and symbols will be used to designate the same elements as those described in the first and second embodiments, and the detailed description thereof will be omitted. The semiconductor memory MEM of this embodiment has a mode register 26G in place of the mode register 26 of the second embodiment. Further, the semiconductor memory MEM has a self test unit 42G coupled to the external terminals CMD, AD, and DT. The other configuration is the same as that of the second embodiment. Namely, the semiconductor memory MEM is formed as a DRAM.

The memory MEM shifts from the normal operation mode to a self test mode when a bit corresponding to the mode register 26G is set by the test command. The mode register 26G activates a self test mode signal STEST during the self test mode, and it inactivates the self test mode signal STEST during the normal operation mode. The memory MEM returns from the self test mode to the normal operation mode when the bit corresponding to the mode register 26 is reset.

During the activation of the self test mode signal STEST (during the self test mode), the self test unit 42G generates a plurality of write test patterns (write access patterns), and sequentially outputs the generated test patterns as an internal command ICMD (write command), an internal address IAD (write address), and internal write data IDT0-7 toward the memory core 24. Thereafter, the self test unit 42G generates a plurality of read test patterns (read access patterns), and sequentially outputs the generated test patterns as an internal command ICMD (read command), and an internal address IAD (read address) toward the memory core 24.

The self test unit 42G compares the read data IDT0-7 sequentially read from the sense amplifier SA with the expected value. When the read data IDT0-7 are different from the expected value, the self test unit 42G detects a defect of the memory cell MC, and activates the defect detection signal FDET. A subsequent operation of the memory MEM is the same as that of the aforementioned second embodiment. The self test unit 42G holds information on the detected defect (address, number of data terminal DT, and the like). After completing the self test, the self test unit 42G outputs the information on the defect in response to a defect information output command supplied from the LSI tester or the like coupled to the memory MEM. Further, for example, by mounting an electrical fuse for relieving defects, a redundancy circuit operating in accordance with a program of the electrical fuse, and the like, on the memory MEM, and by programming the electrical fuse based on the information on the defect, the defect can be relived by the memory MEM itself without using a test apparatus.

Note that, when a defect of the memory cell MC is detected in either of the last four read test patterns, the self test unit 42G further generates a plurality of read test patterns (read access patterns) and executes additional read accesses in order to select the bit line pair BL, /BL coupled to the defective memory cell MC. Accordingly, even when the defect is detected at the last of the test, it is possible to replace the single bit defect with the bit line defect.

As just described, also in the seventh embodiment, the same effect as in the above first and second embodiments can be obtained. Further, in this embodiment, also in the memory MEM having the self test function, it is possible to replace the single bit defect caused by the operation margin in the specific circuit in the memory MEM with the word line defect or the bit line defect. The LSI tester can replace the single bit defect caused by the operation margin in the specific circuit in the memory MEM with the word line defect or the bit line defect based on the information on the defect including the artificial defect held in the self test unit 42G, without changing the test program.

Figure 13:
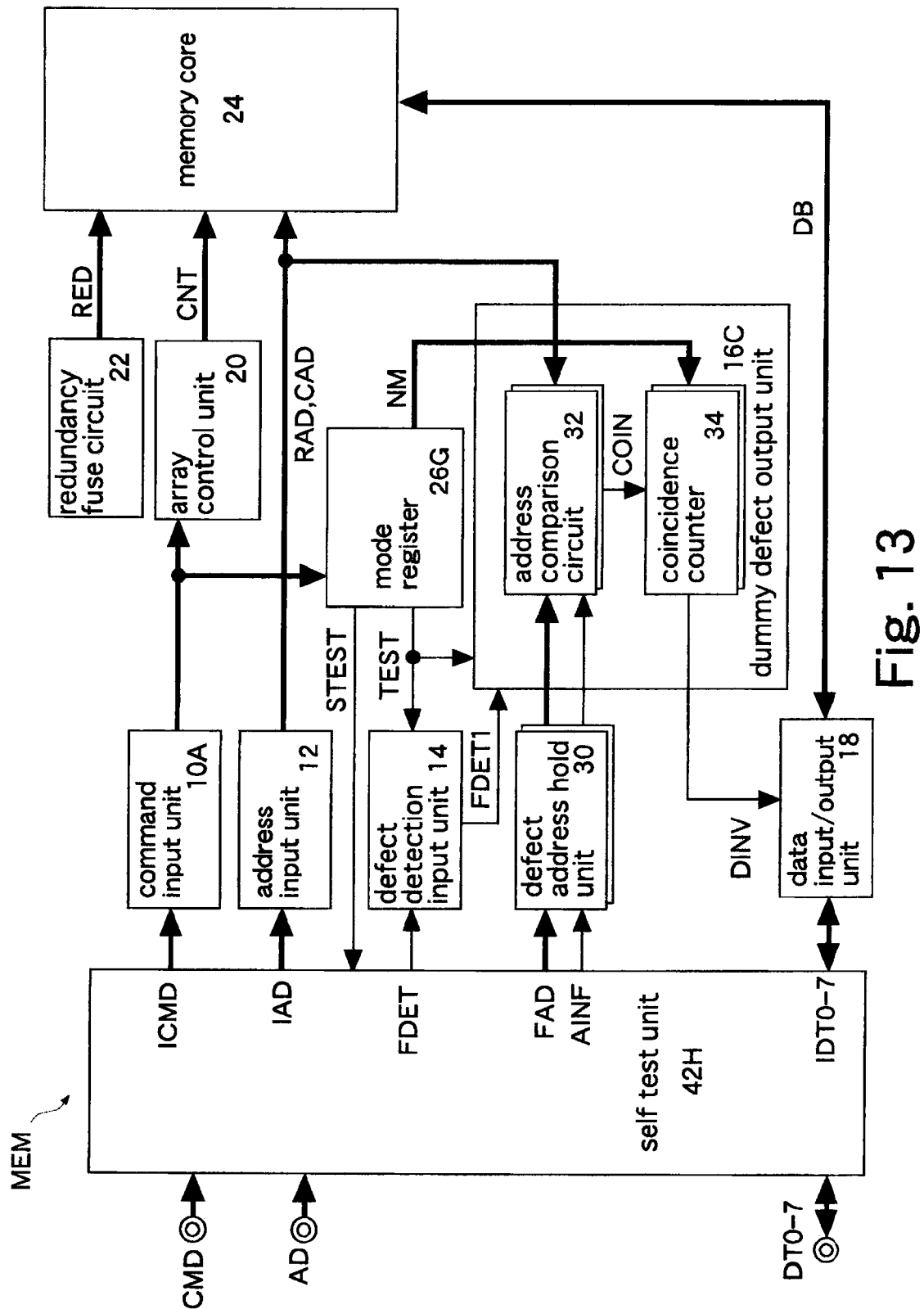
FIG. 13 illustrates a block diagram showing a semiconductor memory according to an eighth embodiment.

FIG. 13 illustrates a semiconductor memory according to an eighth embodiment. The same numerals and symbols will be used to designate the same elements as those described in the first, second, fourth, and seventh embodiments, and the detailed description thereof will be omitted. The semiconductor memory MEM of this embodiment has a mode register 26G in place of the mode register 26 of the fourth embodiment. Further, the semiconductor memory MEM has a self test unit 42H coupled to the external terminals CMD, AD, and DT, similarly as in the seventh embodiment. The other configuration is the same as that of the fourth embodiment. Namely, the semiconductor memory MEM is formed as a DRAM.

The self test unit 42H is configured by adding to the self test unit 42G of the seventh embodiment, a function of outputting the defect address FAD and the address information AINF. The defect address FAD and the address information AINF are output in synchronization with the activation of the defect detection signal FDET, similarly as in the operation of the LSI tester of the fourth embodiment. As just described, also in the eighth embodiment, the same effect as in the above first, fourth and seventh embodiments can be obtained.

Note that in the aforementioned embodiments, examples which are applied to the DRAM were described. However, for example, the present embodiments can be applied to a pseudo SRAM, an SRAM, a flash memory, and the like. The pseudo SRAM is a memory having memory cells of the DRAM, having the same input/output interface as the SRAM, and automatically performing a refresh operation of the memory cells in the inside thereof. A semiconductor memory applying the embodiments may be of a clock asynchronous type or of a clock synchronous type.

In the aforementioned embodiments, examples where the single bit defect caused by the sense amplifier SA is replaced with the bit line defect were mainly described. However, for example, the single bit defect caused by the row decoder RDEC or the word line WL may be replaced with the word line defect. In this case, the period of inverting the logic level of the data DT becomes the period corresponding to the number of access cycles equal to or larger than the number of redundancy bit line pairs RBL, /RBL Concretely, the access number NM is set to the number equal to or larger than the number of redundancy bit line pairs RBL, /RBL.

In the aforementioned fifth and sixth embodiments, examples which are applied to a semiconductor memory MEM having the data compression test function of distributing the write data supplied to the data terminal DT0 to other data DT1-7 were described. However, for example, the embodiment can be applied to a semiconductor memory MEM having a compression control unit 36 in which an expected value register and a bit operational circuit (EOR circuit, for instance) are formed. The expected value register is a register which stores a value for carrying out a bit operation when distributing write data of one bit to other bits in the data compression test. For example, the bit operational circuit carries out an EOR operation with respect to "55 (hexadecimal)" held in the expected value register and "00 (hexadecimal)" in which one-bit data of logic 0 (zero) is distributed, and outputs "55" as write data to the cell array ARY. In the subsequent read access, the data compression control circuit determines whether the read data is correct or not based on the value held in the expected value register as an expected value.

In the aforementioned embodiments, examples which are applied to the semiconductor memory MEM having the bit line pair BL, /BL were described. However, for example, the embodiments can be applied to a semiconductor memory MEM having only the bit line BL.

Further, it is also possible that the compression control unit 36 shown in the fifth and sixth embodiments is provided in the seventh and eighth embodiments.

A proposition of the embodiments is to reduce the test cost by improving a relief efficiency of defects of a semiconductor memory without changing a test environment such as a test apparatus.

According to another aspect of the embodiments, for instance, a number hold circuit stores an access number indicating the number of times that the cell array is accessed. The dummy defect output unit activates, after receiving the defect detection signal, the dummy defect signal until the cell array is accessed by a number of times equal to the access number. Accordingly, any number of defects can be artificially generated inside the semiconductor memory in accordance with the program of the test apparatus. Specifically, an operating specification of the semiconductor memory can be changed in accordance with an environment of the test apparatus.

According to another aspect of the embodiments, for instance, the dummy defect output unit has an address comparison circuit detecting whether each of accesses address sequentially supplied to an address input unit coincides with a defect address held in a defect address hold unit. The dummy defect output unit outputs, after receiving the defect detection signal, the dummy defect signal each time the defect address is accessed, until the number of address coincidence detected by the address comparison circuit reaches the previously set access number. Accordingly, it is possible to generate the artificial defect by targeting only the bit line or the word line coupled to the memory cells in which the defect is detected. Therefore, even when the test apparatus executes a test by accessing a plurality of bit lines or a plurality of word lines at intervals, it is possible to make the test apparatus recognize the bit line defect or the word line defect to which the defective memory cell is coupled.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
   a cell array having a word line and a bit line coupled to memory cells, and a redundancy word line and a redundancy bit line coupled to a redundancy memory cell;
   a read unit reading data held in the memory cells;
   a defect detection input unit receiving a defect detection signal;
   a dummy defect output unit outputting a dummy defect signal during a predetermined period of time after the defect detection input unit receives the defect detection signal; and
   a data output unit inverting a logic of read data output from the read unit during an activation of the dummy defect signal.

2. The semiconductor memory according to claim 1, further comprising:
   an array control unit generating a control signal to access the cell array in response to an external access command; and
   a number hold circuit storing an access number indicating a number of times that the cell array is accessed, wherein
   the dummy defect output unit activates, after receiving the defect detection signal, the dummy defect signal until the cell array is accessed by a number of times equal to the access number.

3. The semiconductor memory according to claim 2, further comprising
   a plurality of redundancy word lines to relieve the word line coupled to a defective memory cell, wherein
   the access number stored by the number hold circuit is equal to or larger than the number of redundancy word lines.

4. The semiconductor memory according to claim 2, further comprising a plurality of redundancy bit lines to relieve the bit line coupled to a defective memory cell, wherein
the access number stored by the number hold circuit is equal to or larger than the number of redundancy bit lines.

5. The semiconductor memory according to claim 2, wherein
the number hold circuit is a mode register storing the access number set from the exterior of the semiconductor memory.

6. The semiconductor memory according to claim 2, wherein
the number hold circuit is a fuse circuit having a fuse and storing the access number in accordance with a program of the fuse.

7. The semiconductor memory according to claim 1, further comprising:
an address input unit receiving an address indicating the memory cells to be accessed; and
a defect address hold unit holding a defect address, wherein
the dummy defect output unit has an address comparison circuit to detect whether each of access addresses supplied to the address input unit coincides with the defect address held in the defect address hold unit, and the dummy defect output unit outputs, after receiving the defect detection signal, the dummy defect signal each time the defect address is accessed, until the number of address coincidence detected by the address comparison circuit reaches the previously set access number.

8. The semiconductor memory according to claim 7, wherein:
the address input unit receives a row address to select the word line and a column address to select the bit line as the access addresses; and
the address comparison circuit compares the defect address with the row address when the defect address indicates the word line, and the address comparison circuit compares the defect address with the column address when the defect address indicates the bit line.

9. The semiconductor memory according to claim 7, wherein:
the defect address hold unit holds a plurality of defect addresses; and
the address comparison circuit compares the access address with each of the plurality of defect addresses, and outputs the dummy defect signal by each of the plurality of defect addresses, until the number of times where the address coincidence is detected reaches the previously set access number.

10. The semiconductor memory according to claim 7, further comprising
a plurality of redundancy word lines to relieve the word line coupled to a defective memory cell, wherein
the previously set access number is equal to or larger than the number of redundancy word lines.

11. The semiconductor memory according to claim 7, further comprising
a plurality of redundancy bit lines to relieve the bit line coupled to a defective memory cell, wherein
the previously set access number is equal to or larger than the number of redundancy bit lines.

12. The semiconductor memory according to claim 1, further comprising:
a plurality of data terminals receiving write data; and
a compression control unit operating during a data compression test mode, distributing the write data received by either of the data terminals to write into memory cells, and outputting a logic indicating coincidence or non-coincidence of the data read from the memory cells as the read data to either of the data terminals via the data output unit, wherein
the data output unit inverts the logic indicating the coincidence and outputs it during the activation of the dummy defect signal.

13. The semiconductor memory according to claim 12, further comprising:
an address input unit receiving an address indicating the memory cells to be accessed; and
a defect address hold unit holding a defect address, wherein
the dummy defect output unit has an address comparison circuit to detect whether each of access addresses supplied to the address input unit coincides with the defect address held in the defect address hold unit, and the dummy defect output unit outputs, after receiving the defect detection signal, the dummy defect signal each time the defect address is accessed, until the number of address coincidence detected by the address comparison circuit reaches the previously set access number.

14. The semiconductor memory according to claim 1, further comprising
a self test unit executing write access and read access to the cell array, detecting a defect of the memory cells by comparing the read data from the data output unit with an expected value, holding information on the detected defect, and outputting the defect detection signal when detecting a defect of either of the memory cells.

15. The semiconductor memory according to claim 14, further comprising:
an address input unit receiving an address indicating the memory cells to be accessed; and
a defect address hold unit holding a defect address, wherein
the dummy defect output unit has an address comparison circuit to detect whether each of access addresses supplied to the address input unit coincides with the defect address held in the defect address hold unit, and the dummy defect output unit outputs, after receiving the defect detection signal, the dummy defect signal each time the defect address is accessed, until the number of address coincidence detected by the address comparison circuit reaches the previously set access number.

16. The semiconductor memory according to claim 14, wherein
the self test unit executes a test by accessing the memory cells a predetermined number of times, and when detecting a defect of either of the memory cells at the time of the last access, further executes a plurality of read accesses to select one of the word line and the bit line coupled to the defective memory cell.

17. The semiconductor memory according to claim 14, wherein
the self test unit outputs the information on the defect held therein in response to a defect information output command.

18. The semiconductor memory according to claim 1, further comprising
a test terminal shifting the semiconductor memory to a test mode, wherein
the defect detection input unit and the dummy defect output unit operate only during the test mode.

19. The semiconductor memory according to claim 1, further comprising a mode register setting an operation mode of the semiconductor memory, wherein the defect detection input unit and the dummy defect output unit operate only when the operation mode is set to a test mode by the mode register.

20. A test system including a semiconductor memory and a test apparatus to test the semiconductor memory, wherein:

the semiconductor memory comprises a cell array having a word line and a bit line coupled to memory cells, and a redundancy word line and a redundancy bit line coupled to a redundancy memory cell, a read unit reading data held in the memory cells, a defect detection input unit receiving a defect detection signal, a dummy defect output unit outputting a dummy defect signal during a predetermined period of time after the defect detection input unit receives the defect detection signal, and a data output unit inverting a logic of read data output from the read unit during an activation of the dummy defect signal; and the test apparatus executes write access and read access to the cell array, detects a defect of the memory cells by comparing the read data from the data output unit with an expected value, holds information on the detected defect, and outputs the defect detection signal when detecting a defect of either of the memory cells.

* * * * *